(12) United States Patent
Mei

(10) Patent No.: US 12,532,599 B2
(45) Date of Patent: Jan. 20, 2026

(54) DISPLAY SUBSTRATE, DISPLAY DEVICE, AND MANUFACTURING METHOD FOR DISPLAY SUBSTRATE

(71) Applicant: BOE Technology Group Co., Ltd., Beijing (CN)

(72) Inventor: Wenhai Mei, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 422 days.

(21) Appl. No.: 17/626,457

(22) PCT Filed: Apr. 22, 2021

(86) PCT No.: PCT/CN2021/088925
§ 371 (c)(1),
(2) Date: Jan. 11, 2022

(87) PCT Pub. No.: WO2021/238515
PCT Pub. Date: Nov. 2, 2021

(65) Prior Publication Data
US 2023/0145503 A1 May 11, 2023

(30) Foreign Application Priority Data
May 27, 2020 (CN) .......................... 202010459803.9

(51) Int. Cl.
*H10K 50/115* (2023.01)
*H10K 50/16* (2023.01)
(Continued)

(52) U.S. Cl.
CPC ........... *H10K 50/115* (2023.02); *H10K 50/16* (2023.02); *H10K 50/85* (2023.02); *H10K 50/856* (2023.02);
(Continued)

(58) Field of Classification Search
CPC ...... H10K 50/115; H10K 50/16; H10K 50/85; H10K 50/856; H10K 71/00; H10K 85/615;
(Continued)

(56) References Cited

U.S. PATENT DOCUMENTS 8,192,590 B1 * 6/2012 Belfield .................. C07B 45/00
204/157.76
2004/0070709 A1 4/2004 Kanou et al.
(Continued)

FOREIGN PATENT DOCUMENTS

CN 101154036 A 4/2008
CN 101221121 A 7/2008
(Continued)

OTHER PUBLICATIONS

CN202010459803.9 first office action.

*Primary Examiner* — Michael Zhang
(74) *Attorney, Agent, or Firm* — IPro, PLLC

(57) ABSTRACT

Disclosed are a display substrate, a display device and a manufacturing method for the display substrate. The display substrate comprises a base substrate, a first electrode located at one side of the base substrate, a charge auxiliary layer located at the side of the first electrode away from the base substrate, and a second electrode located at the side of the charge auxiliary layer away from the first electrode; the surface of the charge auxiliary layer away from the first electrode is provided with a plurality of relief structures distributed in an array; an acid generator is mixed in the charge auxiliary layer, and the content of the acid generator in regions of different thicknesses of the charge auxiliary layer is different.

19 Claims, 4 Drawing Sheets

(51) Int. Cl.
    *H10K 50/85*         (2023.01)
    *H10K 50/856*       (2023.01)
    *H10K 85/60*         (2023.01)

(52) U.S. Cl.
    CPC ......... *H10K 85/615* (2023.02); *H10K 85/636* (2023.02); *H10K 50/167* (2023.02); *H10K 85/654* (2023.02)

(58) Field of Classification Search
    CPC .. H10K 85/636; H10K 50/167; H10K 85/654; H10K 50/14; H10K 50/15; H10K 50/171; H10K 2102/00; H10K 2102/3026
    See application file for complete search history.

(56) References Cited

U.S. PATENT DOCUMENTS

| | | |
|---|---|---|
| 2008/0076128 A1 | 3/2008 | Hah et al. |
| 2008/0299486 A1 | 12/2008 | Mahoney et al. |
| 2015/0236300 A1 | 8/2015 | Naraoka |
| 2017/0054112 A1 | 2/2017 | Sato et al. |
| 2018/0166643 A1* | 6/2018 | Kim .................... H10K 50/115 |

FOREIGN PATENT DOCUMENTS

| | | |
|---|---|---|
| CN | 101681109 A | 3/2010 |
| CN | 106256168 A | 12/2016 |
| CN | 107293647 A | 10/2017 |
| CN | 108232019 A | 6/2018 |
| JP | 2015099320 A | 5/2015 |
| WO | 2011086997 A1 | 7/2011 |

\* cited by examiner

DISPLAY SUBSTRATE, DISPLAY DEVICE, AND MANUFACTURING METHOD FOR DISPLAY SUBSTRATE

CROSS-REFERENCE TO RELATED APPLICATIONS

The present disclosure is a National Stage of International Application No. PCT/CN2021/088925, filed on Apr. 22, 2021, which claims priority to the Chinese Patent Application No. 202010459803.9, filed to China National Intellectual Property Administration on May 27, 2020, both of which are incorporated herein by reference.

FIELD

The present disclosure relates to the technical field of display, in particular to a display substrate, a display apparatus, and a manufacturing method for the display substrate.

BACKGROUND

A quantum dots light emitting diode display (QLED) is a novel display technology developed on the basis of an organic light emitting display. The two displays are different in that a light emitting layer of the QLED is a quantum dot layer; and a principle of the QLED is that electrons/holes are injected into the quantum dot layer through an electron/hole transport layer, and the electrons and the holes achieve recombination light emission in the quantum dot layer. Compared with the organic light emitting display device, the QLED has the advantages of a narrow light emitting peak, high color saturation, and a wide color gamut.

SUMMARY

An embodiment of the present disclosure provides a display substrate, including: a base substrate; a first electrode, on one side of the base substrate; a charge auxiliary layer, on one side of the first electrode away from the base substrate; a second electrode, on one side of the charge auxiliary layer away from the first electrode; and a quantum dot light emitting layer, between the first electrode and the second electrode. A surface of the charge auxiliary layer away from the first electrode has a plurality of concave-convex structures distributed in an array, an acid generator is mixed in the charge auxiliary layer, and contents of the acid generator in regions with different thicknesses of the charge auxiliary layer are different.

In one possible implementation, the charge auxiliary layer includes: a convex region, and a concave region; and in a direction perpendicular to the base substrate, a thickness of the charge auxiliary layer in the convex region is larger than a thickness of the charge auxiliary layer in the concave region.

In one possible implementation, the concave region includes: a first-type concave region, and a second-type concave region; and in the direction perpendicular to the base substrate, a thickness of the charge auxiliary layer in the first-type concave region is larger than a thickness of the charge auxiliary layer in the second-type concave region.

In one possible implementation, a content of the acid generator corresponding to the convex region is larger than a content of the acid generator corresponding to the first-type concave region; and the content of the acid generator corresponding to the first-type concave region is larger than a content of the acid generator corresponding to the second-type concave region.

In one possible implementation, the charge auxiliary layer includes at least one of the following film layers: an electron injection layer; an electron transport layer; a hole transport layer; or a hole injection layer.

In one possible implementation, the charge auxiliary layer is the electron transport layer, and a material of the electron transport layer is a metallic oxide mixed with the acid generator.

In one possible implementation, the metallic oxide is zinc oxide.

In one possible implementation, the first electrode is an anode, the second electrode is a cathode, and the quantum dot light emitting layer is on one side of the electron transport layer facing the base substrate; and a space between the first electrode and the quantum dot light emitting layer further includes: the hole injection layer, and the hole transport layer between the hole injection layer and the quantum dot light emitting layer.

In one possible implementation, the first electrode is a cathode, the second electrode is an anode, and the quantum dot light emitting layer is on one side of the electron transport layer away from the base substrate; and a space between the second electrode and the quantum dot light emitting layer further includes: the hole injection layer, and the hole transport layer located between the hole injection layer and the quantum dot light emitting layer.

In one possible implementation, an energy level of a lowest unoccupied molecular orbital of the acid generator is larger than 2 eV and smaller than 4 eV.

In one possible implementation, the acid generator includes triazines, iodonium salts, sulfoniums, or perfluorobutyls.

In one possible implementation, the acid generator further includes triphenylamine, fluorene, or a carbazole group.

In one possible implementation, the acid generator includes:

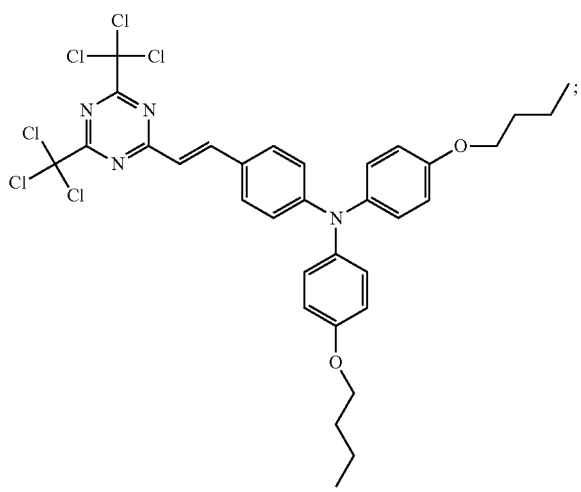

-continued or,

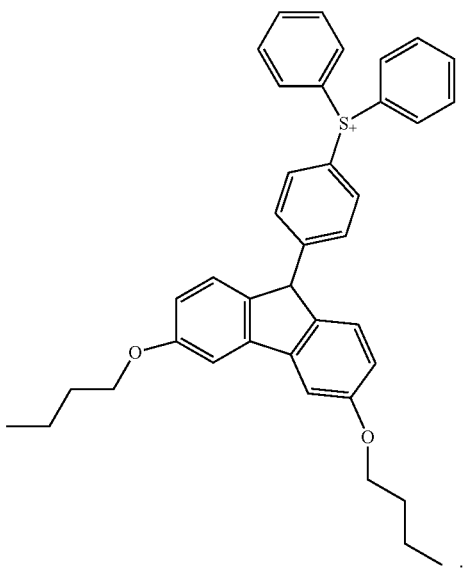

In one possible implementation, the acid generator is a photosensitive acid generator.

An embodiment of the present disclosure further provides a display apparatus, including the display substrate provided by the embodiment of the present disclosure.

An embodiment of the present disclosure further provides a manufacturing method for the display substrate provided by the embodiment of the present disclosure. The manufacturing method includes: forming the first electrode on one side of the base substrate; forming the charge auxiliary layer mixed with the acid generator on one side of the first electrode away from the base substrate; using preset light to irradiate the charge auxiliary layer under shielding of a mask, so that a convex-concave structure is formed on a surface of the charge auxiliary layer away from the first electrode and contents of the acid generator in regions with different thicknesses of the charge auxiliary layer are different, wherein the mask has a first region and a second region, and light transmittance of the first region and the second region is different; and forming the second electrode on one side of the charge auxiliary layer away from the first electrode, and forming the quantum dot light emitting layer before forming the second electrode.

In one possible implementation, the charge auxiliary layer is zinc oxide mixed with the acid generator; and the forming the charge auxiliary layer mixed with the acid generator on the side of the first electrode away from the base substrate includes: mixing and dissolving zinc oxide particles and the acid generator to form a mixed solution; and spin-coating the mixed solution on the side of the first electrode away from the base substrate using a spin-coating process.

DETAILED DESCRIPTION OF THE EMBODIMENTS

At present, a QLED device mainly adopts a top emission device structure due to influences of factors such as aperture ratio. A main problem of a top emission device lies in that a light extraction efficiency is relatively low, which strongly affect performance of the device. At present, with regard to a light extraction mode, the QLED device has the problems of complicated processes and poor uniformity of periodic structures.

In order to make the objectives, technical solutions, and advantages of the embodiments of the present disclosure clearer, the technical solutions of the embodiments of the present disclosure will be described clearly and completely in conjunction with the accompanying drawings of the embodiments of the present disclosure. Obviously, the described embodiments are part of the embodiments of the present disclosure, rather than all of the embodiments. Based on the described embodiments of the present disclosure, all other embodiments obtained by those of ordinary skill in the art without creative labor are within the protection scope of the present disclosure.

Unless otherwise defined, the technical terms or scientific terms used in the present disclosure shall have the usual meanings understood by those of ordinary skill in the art to which the present disclosure belongs. "First", "second" and similar words used in the present disclosure do not indicate any order, quantity or importance, but are only configured to distinguish different components. "Include" or "comprise" and other similar words mean that the element or item appearing before the word includes the element or item listed after the word and its equivalents, but does not exclude other elements or items. "Connected", "linked" and similar words are not limited to physical or mechanical connections, but may include electrical connections, whether direct or indirect. "Upper", "lower", "left", "right", etc. are only configured to indicate the relative positional relationship. When the absolute position of the described object changes, the relative positional relationship may also change accordingly.

In order to keep the following description of the embodiments of the present disclosure clear and concise, the present disclosure omits detailed descriptions of known functions and known components.

Figure 1:
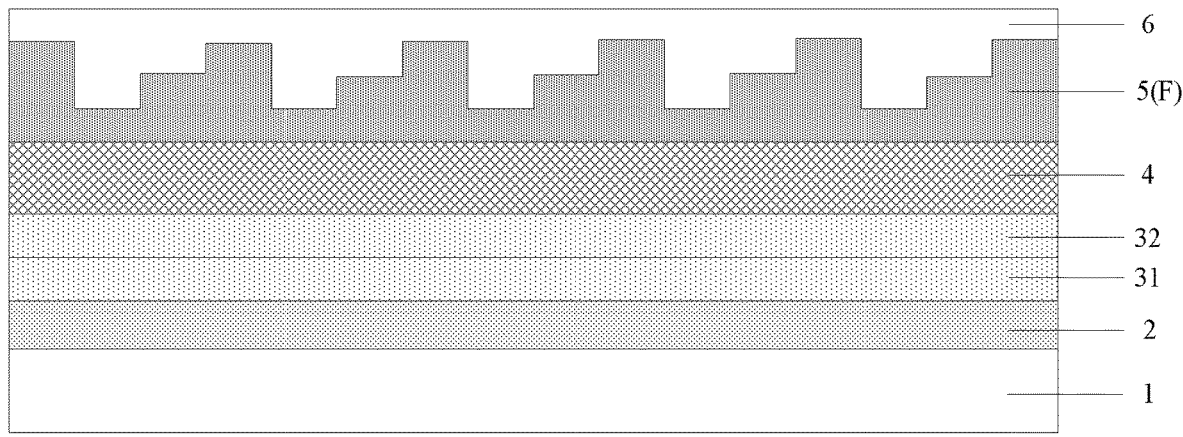
FIG. 1 is a schematic structural diagram of a display substrate provided by an embodiment of the present disclosure.

As shown in FIG. 1, a display substrate provided by an embodiment of the present disclosure includes a base substrate 1, a first electrode 2 located on one side of the base substrate 1, a charge auxiliary layer F located on one side of the first electrode 2 away from the base substrate 1, a second electrode 6 located on one side of the charge auxiliary layer F away from the first electrode 2, and a quantum dot light emitting layer 4 located between the first electrode 2 and the second electrode 6.

A surface of the charge auxiliary layer F away from the first electrode 2 is provided with a plurality of concave-convex structures distributed in an array, an acid generator is mixed in the charge auxiliary layer F, and contents of the acid generator in regions with different thicknesses of the charge auxiliary layer F are different. The acid generator may be a photosensitive acid generator (PAG). Different depths of the charge auxiliary layer F are etched out by the acid generator when being irradiated by preset light with different intensities, so as to form the concave-convex structures of the charge auxiliary layer F. The preset light may specifically be ultraviolet light.

Figure 2:
FIG. 2 is a schematic diagram of a reaction generated by a charge auxiliary layer provided by an embodiment of the present disclosure under light irradiation.
Figure 3:
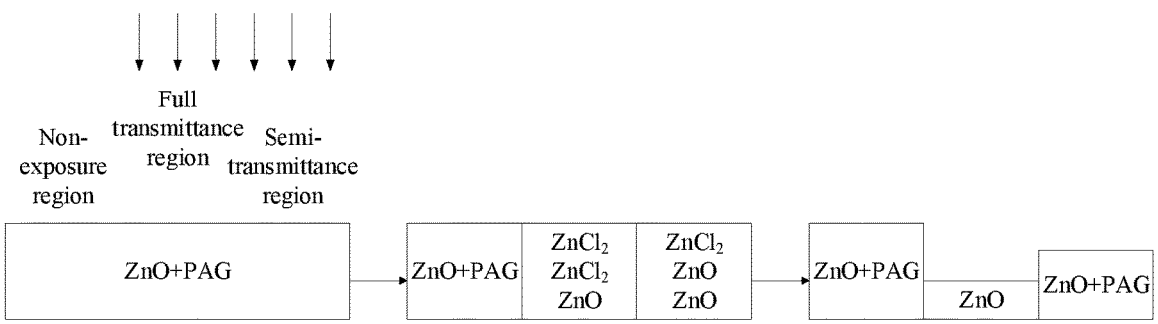
FIG. 3 is a schematic diagram of another reaction generated by a charge auxiliary layer provided by an embodiment of the present disclosure under light irradiation.

According to the display substrate provided by the embodiment of the present disclosure, the charge auxiliary layer F (such as zinc oxide) is mixed with the acid generator. In manufacturing, a mask with different light transmittance may be adopted for preset light irradiation on the charge auxiliary layer F mixed with the acid generator, and a reaction shown in FIG. 2 may be generated. The mask is designed into a structure shown in FIG. 3, and is provided with periodic shielded regions (non-exposure regions), full transmittance regions and semi-transmittance regions. In the full transmittance regions, because a dose of the preset light transmitted is larger, the preset light can reach a larger depth into the charge auxiliary layer F, the acid generator generates more acid, etching of the charge auxiliary layer F is larger, and the etch depth is larger. In the semi-transmittance regions, because a dose of the preset light transmitted is smaller, the preset light can reach a smaller depth into the charge auxiliary layer F, and etch depth of the charge auxiliary layer F is smaller. The shielded regions may be free of preset light irradiation. Because the full transmittance regions and the semi-transmittance regions are periodically arranged, periodic convex-concave micro-array structures with different film thickness are finally formed on the charge auxiliary layer F. The array-type convex-concave structures are conducive to reflecting light limited inside the charge auxiliary layer to an upper film layer due to total reflection, and the light extraction efficiency is improved. In addition, compared with other modes such as nanoimprinting, micro-nano machining means and the like, the mode of forming the convex-concave structures provided by the embodiment of the present disclosure has the advantages of a simple process and better uniformity of the convex-concave structures, so problems that a display substrate in the related art is complicated in processes and poor in uniformity of periodic structures can be solved.

During specific implementation, the display substrate in the embodiment of the present disclosure may be a quantum dots light emitting display substrate. Specifically, the display substrate may be a top emission display substrate where light is emitted from one side of the second electrode 6.

Figure 4A:
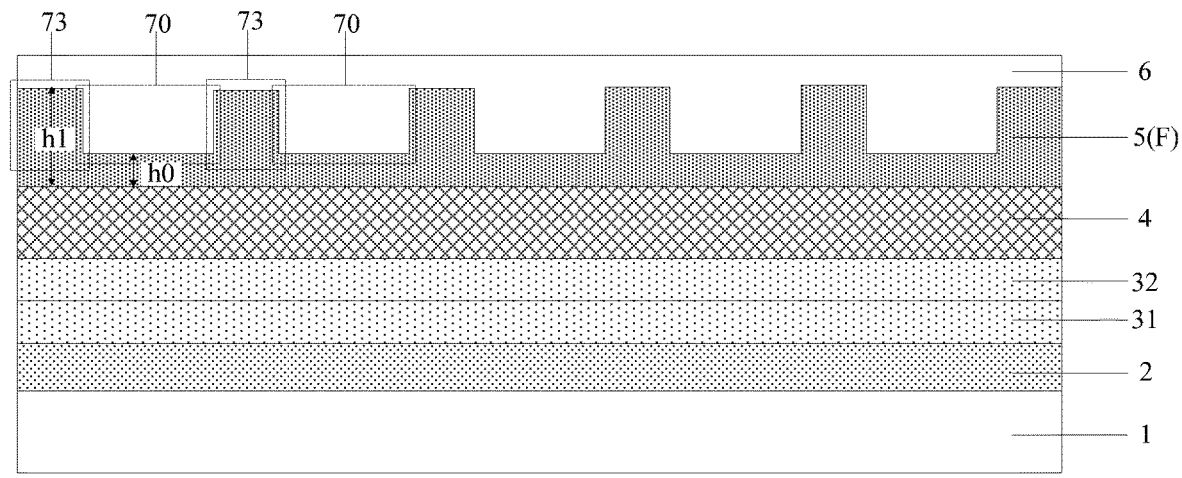
FIG. 4A is a schematic diagram of thicknesses of different positions of a concave-convex structure provided by an embodiment of the present disclosure.

During specific implementation, as shown in FIG. 4A, each convex-concave structure includes: a convex region 73, and a concave region 70. In a direction perpendicular to the base substrate 1, a thickness h1 of the charge auxiliary layer F in the convex region 73 is larger than a thickness h0 in the concave region 70.

Figure 4B:
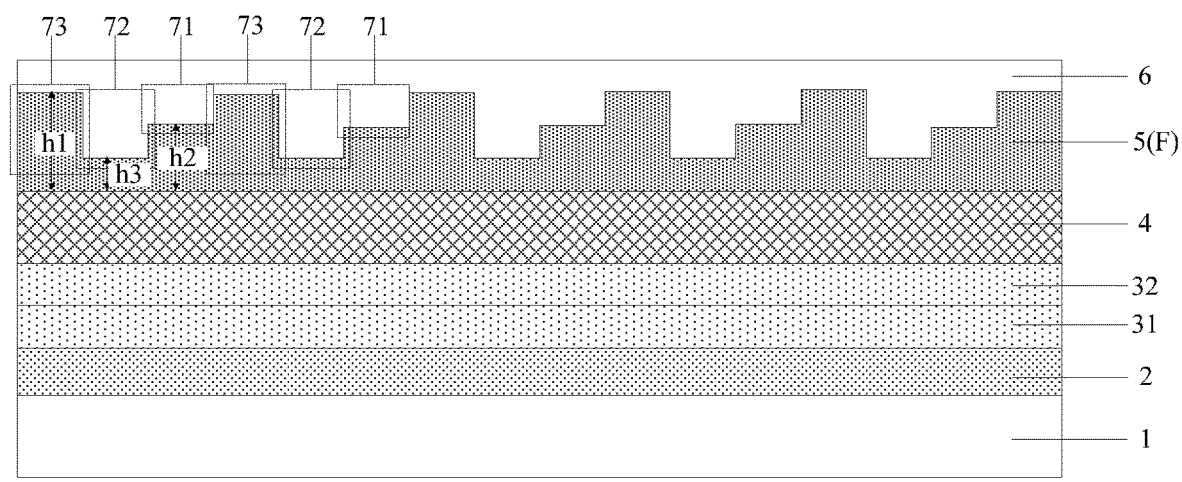
FIG. 4B is a schematic diagram of another thicknesses of different positions of a concave-convex structure provided by an embodiment of the present disclosure.

Specifically, as shown in FIG. 4B, the concave region 70 may include: a first-type concave region 71 and a second-type concave region 72. In the direction perpendicular to the base substrate 1, a thickness h2 of the charge auxiliary layer F in the first-type concave region 71 is larger than a thickness h3 of the charge auxiliary layer F in the second-type concave region 72. In the embodiment of the present disclosure, each convex-concave structure has regions with three different depths. Compared with regions of only two different depths, a total reflection path of the light may be broken more efficiently, so more light is extracted.

Specifically, a content of the acid generator corresponding to the convex region 73 is larger than a content of the acid generator corresponding to the first-type concave region 71; and the content of the acid generator corresponding to the first-type concave region 71 is larger than a content of the acid generator corresponding to the second-type concave region 72. In specific manufacturing, before patterning the charge auxiliary layer F, film layer thicknesses of the charge auxiliary layer F at different positions are substantially equal, and contents of the acid generator at different positions are substantially equal; and by irradiating different positions with the preset light with different intensities, the amounts of the acid generator participating the reaction in different regions are different, so finally, the remaining contents of the acid generator at different regions are different.

Figure 5:
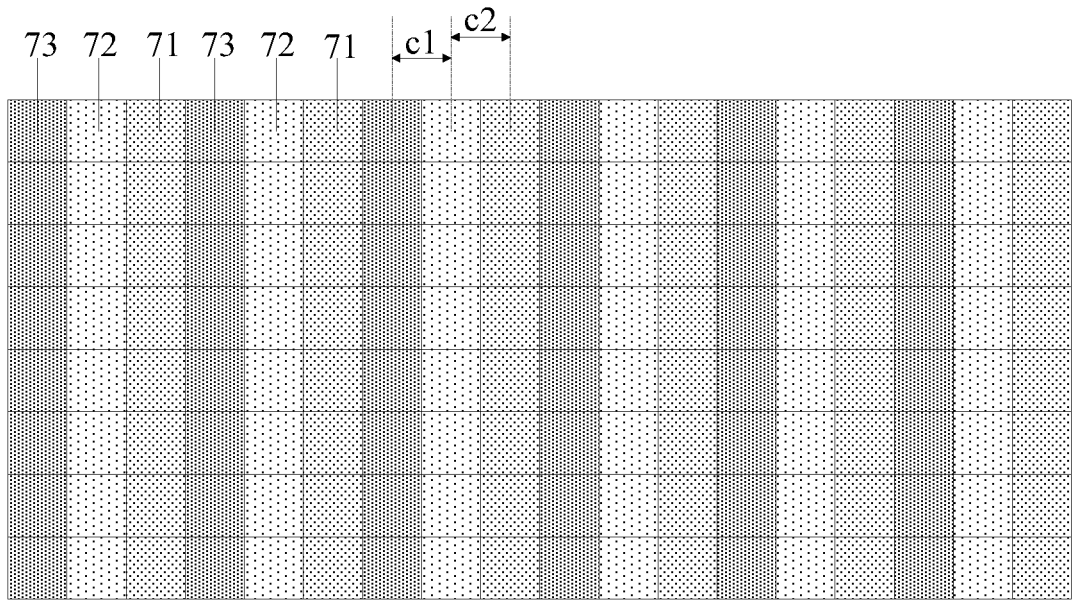
FIG. 5 is a schematic diagram of intervals among different positions of a concave-convex structure provided by an embodiment of the present disclosure.

Specifically, during specific implementation, as shown in FIG. 5, the convex-concave structures distributed in an array may be distributed in multiple rows and multiple columns, i.e. each row of the convex-concave structures may include the convex region 73, the second-type concave region 72 and the first-type concave region 71 which are arranged in succession; and a distance c1 between a center of a convex region 73 and a center of a second-type concave region 72 adjacent to the convex region 73 may be 1 μm-50 μm, and a distance c2 between a center of a second-type concave region 72 and a first-type concave region 71 adjacent to the second-type concave region 72 may be 1 μm-50 μm.

During specific implementation, in the embodiment of the present disclosure, the charge auxiliary layer F may be one or a combination of the following film layers: an electron injection layer, an electron transport layer, a hole transport layer, or a hole injection layer. That is, the convex-concave structures may be formed in a surface of one of the electron injection layer, the electron transport layer, the hole transport layer, or the hole injection layer, and the convex-concave structures may also be formed in a plurality of layers among them. During specific implementation, corresponding arrangement may be performed according to specific materials of the film layers.

During specific implementation, as shown in FIG. 1, the charge auxiliary layer F is the electron transport layer 5, and a material of the electron transport layer 5 is a metallic oxide mixed with the acid generator. Specifically, the metallic oxide is zinc oxide. In the embodiment of the present disclosure, the material of the electron transport layer 5 is zinc oxide mixed with the acid generator, i.e. zinc oxide may serve as the electron transport layer. Zinc oxide itself has relatively good electron transport performance and may react with acid generated by the acid generator under preset light irradiation. Therefore, the electron transport layer may have better electron transport performance while the convex-concave structures may be easily formed on its surface.

During specific implementation, the first electrode 2 may be an anode, and the second electrode 6 may be a cathode. As shown in FIG. 1, the quantum dot light emitting layer 4 is located on one side of the electron transport layer 5 facing the base substrate 1. A space between the first electrode 2 and the quantum dot light emitting layer 4 is further provided with a hole injection layer 31, and a hole transport layer 32 located between the hole injection layer 31 and the quantum dot light emitting layer 4. That is, the anode (the first electrode 2), the hole injection layer 31, the hole transport layer 32, the quantum dot light emitting layer 4, the electron transport layer 5, and the cathode (the second electrode 6) may be sequentially formed on the base substrate 1.

Figure 4C:
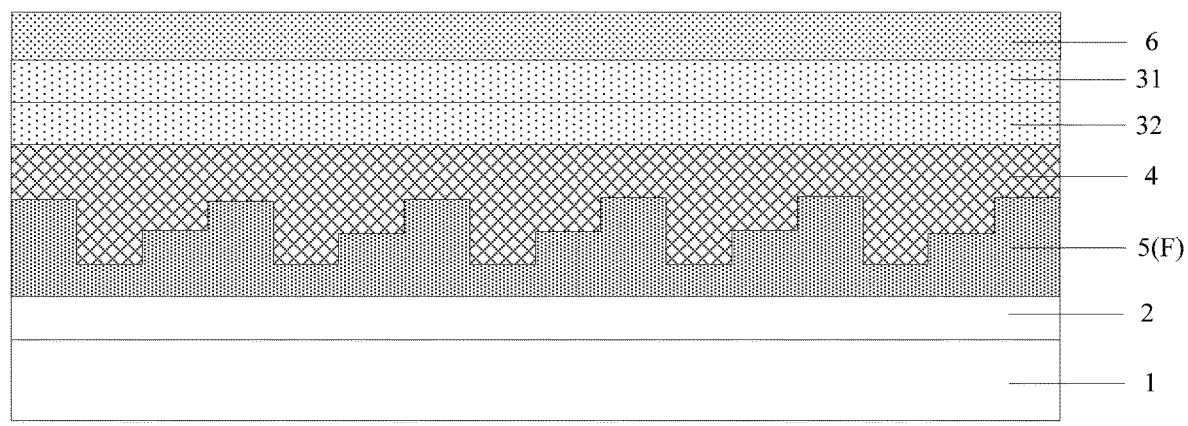
FIG. 4C is a schematic structural diagram of another display substrate provided by an embodiment of the present disclosure.

Or, during specific implementation, the first electrode 2 may be a cathode, and the second electrode 6 may be an anode. As shown in FIG. 4C, the quantum dot light emitting layer 4 is located on one side of the electron transport layer 5 away from the base substrate 1. A space between the second electrode 6 and the quantum dot light emitting layer 4 is further provided with a hole injection layer 31, and a hole transport layer 32 located between the hole injection layer 31 and the quantum dot light emitting layer 4. That is, the cathode (the first electrode 2), the electron transport layer 5, the quantum dot light emitting layer 4, the hole transport layer 32, the hole injection layer 31, and the anode (the second electrode 6) may be sequentially formed on the base substrate 1.

During specific implementation, an energy level of a lowest unoccupied molecular orbital (LUMO) level of the acid generator may be larger than 2 eV and smaller than 4 eV. In the embodiment of the present disclosure, when the LUMO level of the acid generator is larger than 2 eV and smaller than 4 eV, an LUMO level of the electron transport layer is usually improved, a barrier for transmitting electrons to the quantum dot light emitting layer is formed, and a transfer rate of the electrons may be reduced, which is conducive to improving a light emitting efficiency of the display substrate.

During specific implementation, the acid generator includes triazines, iodonium salts, sulfoniums, or perfluorobutyls. Specifically, the acid generator may further include triphenylamine, fluorene, or a carbazole group. In the embodiment of the present disclosure, the acid generator includes the triphenylamine, the fluorene, or the carbazole group, which may be conducive to hole transport and further may reduce the transfer rate of the electron transport layer.

Specifically, the acid generator may be.

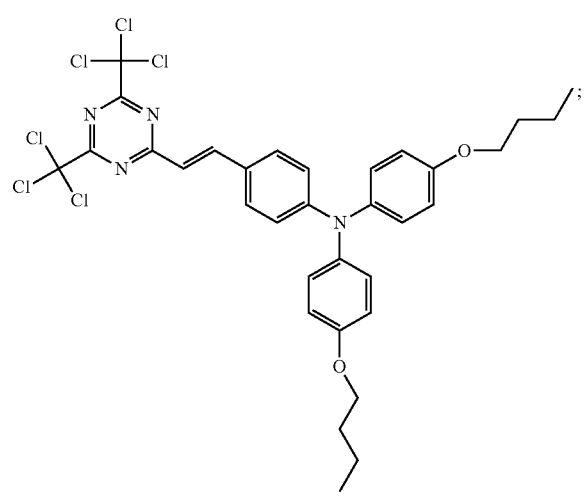

or,

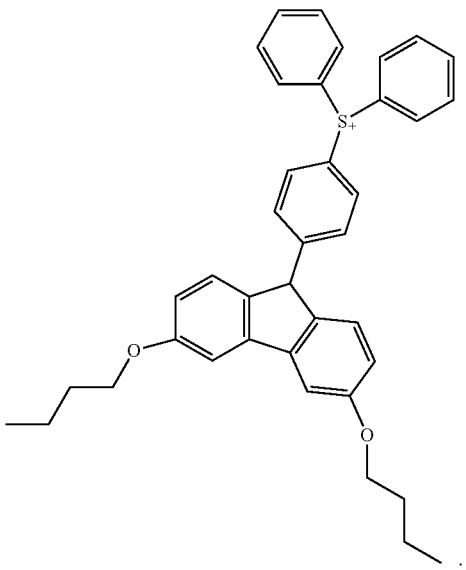

An embodiment of the present disclosure further provides a display apparatus, including the display substrate provided by the embodiment of the present disclosure.

Figure 6:
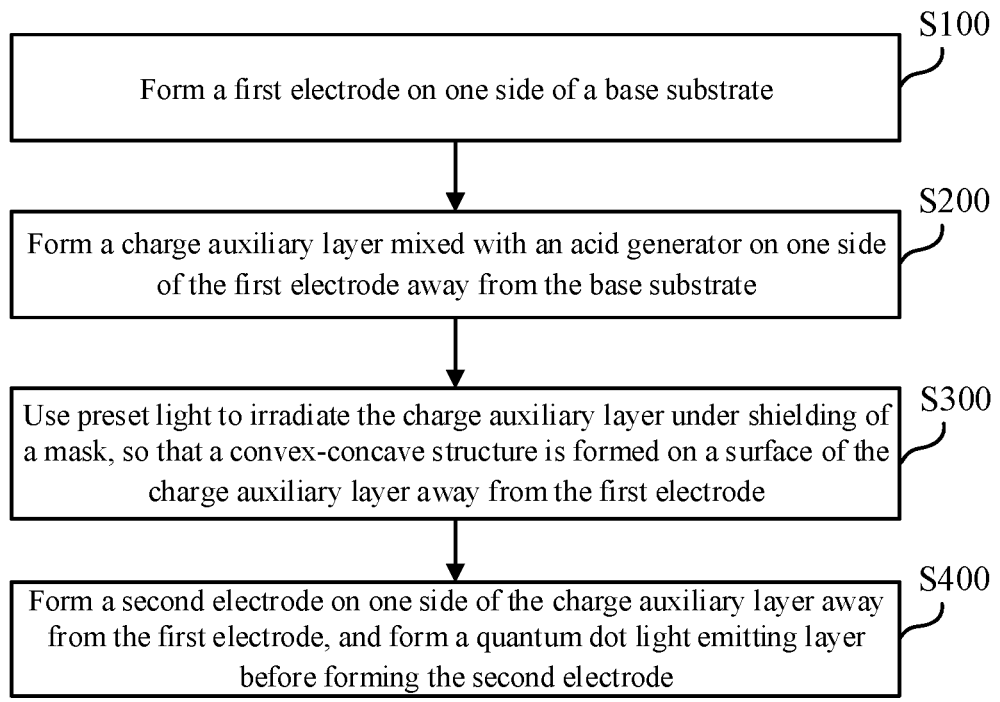
FIG. 6 is a schematic diagram of a manufacturing process of a display substrate provided by an embodiment of the present disclosure.

As shown in FIG. 6, an embodiment of the present disclosure further provides a manufacturing method for the display substrate provided by the embodiment of the present disclosure. The manufacturing method includes the following.

Step S100, a first electrode is formed on one side of a base substrate.

Step S200, a charge auxiliary layer mixed with an acid generator is formed on one side of the first electrode away from the base substrate.

Step S300, preset light is used to irradiate the charge auxiliary layer under shielding of a mask, so that a convex-concave structure is formed on a surface of the charge auxiliary layer away from the first electrode and contents of the acid generator in regions with different thicknesses of the charge auxiliary layer are different, wherein the mask has a first region and a second region, and light transmittance of the first region and the second region is different.

Step S400, a second electrode is formed on one side of the charge auxiliary layer away from the first electrode, and a quantum dot light emitting layer is formed before the second electrode is formed.

Figure 7:
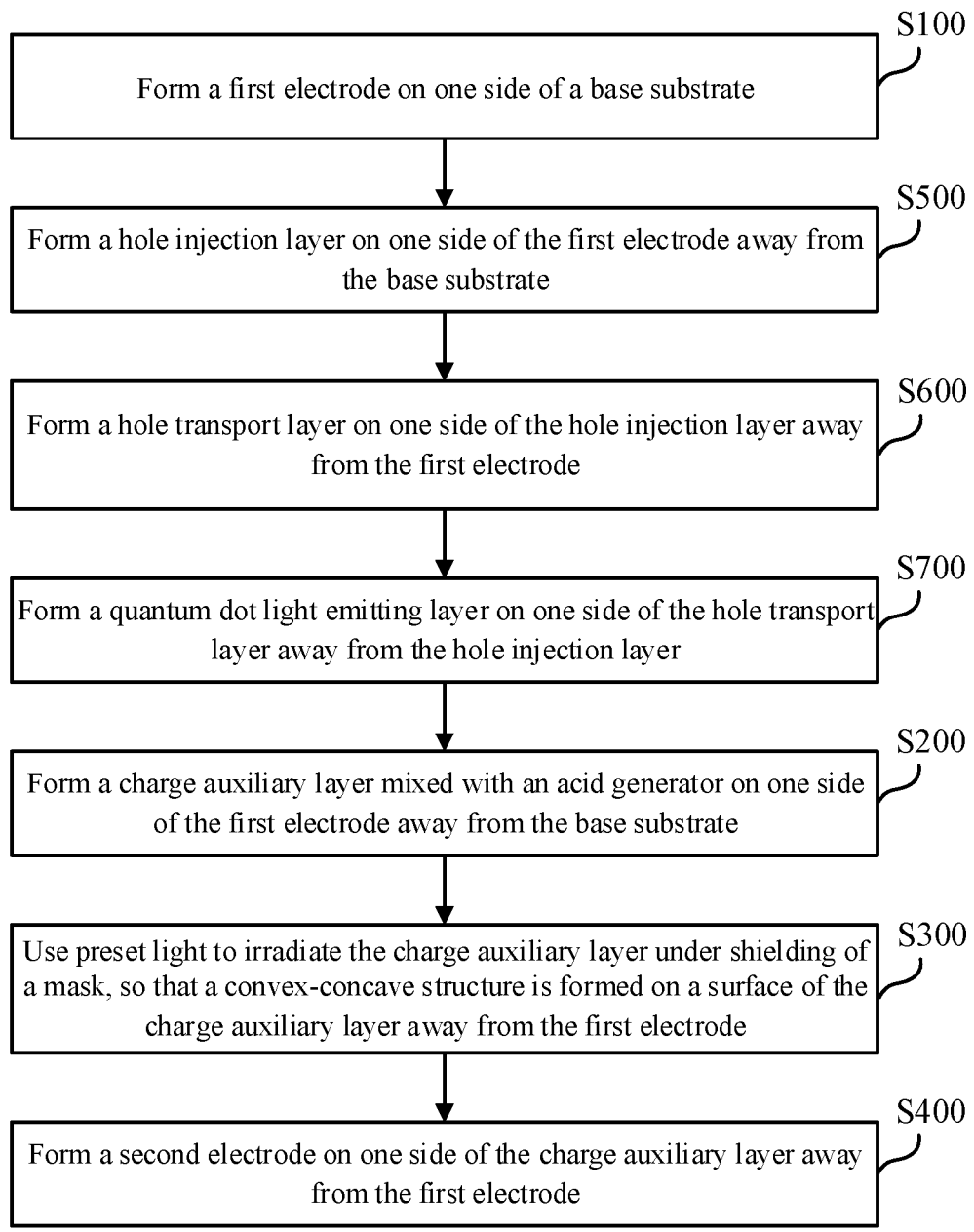
FIG. 7 is a schematic diagram of a manufacturing process of a specific display substrate provided by an embodiment of the present disclosure.

During specific implementation, to take the charge auxiliary layer being an electron transport layer as an example, as shown in FIG. 7, after step S100, and before step S200, i.e. after the first electrode is formed on the side of the base substrate, and before the charge auxiliary layer mixed with the acid generator is formed on the side of the first electrode away from the base substrate, the manufacturing method further includes the following.

Step S500, a hole injection layer is formed on the side of the first electrode away from the base substrate.

Step S600, a hole transport layer is formed on one side of the hole injection layer away from the first electrode.

Step S700, the quantum dot light emitting layer is formed on one side of the hole transport layer away from the hole injection layer.

During specific implementation, the charge auxiliary layer is zinc oxide mixed with the acid generator. Step S200, i.e. the charge auxiliary layer mixed with the acid generator is formed on the side of the first electrode away from the base substrate, includes: zinc oxide particles and the acid generator are mixed and dissolved to form a mixed solution; and the mixed solution is spin-coated on the side of the first electrode away from the base substrate using a spin-coating process.

Specifically, to take the quantum dot light emitting layer being cadmium selenide/zinc sulfide (CdSe/ZnS) red quantum dots as an example, the acid generator (PAG) is 2-chloro-4,6-diphenyl-1,3,5-triazine. To take the charge auxiliary layer being zinc oxide mixed with the acid generator as an example, the manufacturing method for the base substrate provided by the embodiment of the present disclosure is described in detail as follows.

Poly(3,4-ethylenedioxythiophene) (PEDOT) is spin-coated on the base substrate deposited with indium tin oxide/silver/indium tin oxide (ITO/Ag/ITO) as the anode at a spinning speed of 2500 rpm to serve as the hole injection layer, annealing is performed at 200° C. for 5 minutes, a material of the hole transport layer is spin-coated at 3000 rpm, annealing is performed at 250° C. for 30 minutes, a quantum dot light emitting material is spin-coated at 2500 rpm, and annealing is performed at 120° C. for 10 minutes; zinc oxide nanoparticles and the PAG are dissolved together to form a solution with a mass fraction of the PAG being 20% and a concentration being 30 mg/ml; an exposure machine is configured to expose the film layer at the exposure amount of 1000 mj/cm$^2$, the mask with periodic full transmittance regions and semi-transmittance regions is used for exposure, and after periodic structures are formed by etching, spin-coating is performed at 2500 rpm before annealing at 120° C. for 20 minutes. Indium Gallium Zinc Oxide (IGZO) is evaporated as the cathode.

If a sol-gel method is adopted for spin-coating to prepare the electron transport layer, before spin-coating, the acid generator and a precursor solution for making a material of the electron transport layer may be mixed.

According to the display substrate, the display apparatus and the manufacturing method for the display substrate provided by the embodiments of the present disclosure, the charge auxiliary layer is mixed with the acid generator, periodic full transmittance exposure and semi-transmittance exposure are realized through the design of the mask. During full transmittance exposure, because a dose of the preset light transmitted is larger, the preset light can reach a larger depth into the charge auxiliary layer, the acid generator generates more acid, etching for the charge auxiliary layer is heavier, and the etch depth of the charge auxiliary layer is larger. During semi-transmittance exposure, because a dose of the preset light transmitted is smaller, the preset light can reach a smaller depth into the charge auxiliary layer, and etching for the charge auxiliary layer is slighter. Because the full transmittance regions and the semi-transmittance regions are periodically arranged, periodic convex-concave micro-array structures with different film thickness are finally formed on the charge auxiliary layer. The array-type convex-concave structures are conducive to reflecting light limited inside a first film layer due to total reflection to an upper film layer, and the light extraction efficiency is improved. In addition, compared with other modes such as nanoimprinting, micro-nano machining means and the like, the mode of forming the convex-concave structures provided by the embodiment of the present disclosure has the advantages of simple process and better uniformity of the convex-concave structures, so many problems that a display substrate in the related art is complicated in processes and poor in uniformity of periodic structures can be solved.

Obviously, those of skill in the art can make various changes and modifications to the present disclosure without departing from the spirit and scope of the present disclosure. In this way, if these variations and modifications of the present disclosure fall within the scope of the claims of the present disclosure and equivalent technologies, the present disclosure also intends to include these modifications and variations.

What is claimed is:

1. A display substrate, comprising:
    a base substrate;
    a first electrode on one side of the base substrate;
    a charge auxiliary layer on one side of the first electrode away from the base substrate;
    a second electrode on one side of the charge auxiliary layer away from the first electrode; and
    a quantum dot light emitting layer between the first electrode and the second electrode; wherein
    a surface of the charge auxiliary layer away from the first electrode has a plurality of concave-convex structures distributed in an array, an acid generator is mixed in the charge auxiliary layer, and contents of the acid generator in regions with different thicknesses of the charge auxiliary layer are different.

2. The display substrate according to claim 1, wherein the charge auxiliary layer comprises: a convex region, and a concave region; and
    in a direction perpendicular to the base substrate, a thickness of the charge auxiliary layer in the convex region is larger than a thickness of the charge auxiliary layer in the concave region.

3. The display substrate according to claim 2, wherein the concave region comprises: a first-type concave region, and a second-type concave region; and
    in the direction perpendicular to the base substrate, a thickness of the charge auxiliary layer in the first-type concave region is larger than a thickness of the charge auxiliary layer in the second-type concave region.

4. The display substrate according to claim 3, wherein a content of the acid generator corresponding to the convex region is larger than a content of the acid generator corresponding to the first-type concave region; and the content of the acid generator corresponding to the first-type concave region is larger than a content of the acid generator corresponding to the second-type concave region.

5. The display substrate according to claim 1, wherein the charge auxiliary layer comprises at least one of the following film layers:
    an electron injection layer;
    an electron transport layer;
    a hole transport layer; or
    a hole injection layer.

6. The display substrate according to claim 5, wherein the charge auxiliary layer is the electron transport layer, and a material of the electron transport layer is a metallic oxide mixed with the acid generator.

7. The display substrate according to claim 6, wherein the first electrode is an anode, the second electrode is a cathode, and the quantum dot light emitting layer is on one side of the electron transport layer facing the base substrate; and a space between the first electrode and the quantum dot light emitting layer further comprises the hole injection layer and the hole transport layer between the hole injection layer and the quantum dot light emitting layer.

8. The display substrate according to claim 6, wherein the first electrode is a cathode, the second electrode is an anode, and the quantum dot light emitting layer is on one side of the electron transport layer away from the base substrate; and a space between the second electrode and the quantum dot light emitting layer further comprises the hole injection layer and the hole transport layer between the hole injection layer and the quantum dot light emitting layer.

9. The display substrate according to claim 1, wherein an energy level of a lowest unoccupied molecular orbital of the acid generator is larger than 2 eV and smaller than 4 eV.

10. The display substrate according to claim 1, wherein the acid generator is a photosensitive acid generator.

11. The display substrate according to claim 1, wherein the acid generator comprises triazines, iodonium salts, sulfoniums, or perfluorobutyls.

12. The display substrate according to claim 11, wherein the acid generator further comprises triphenylamine, fluorene, or a carbazole group.

13. The display substrate according to claim 11, wherein the acid generator comprises:

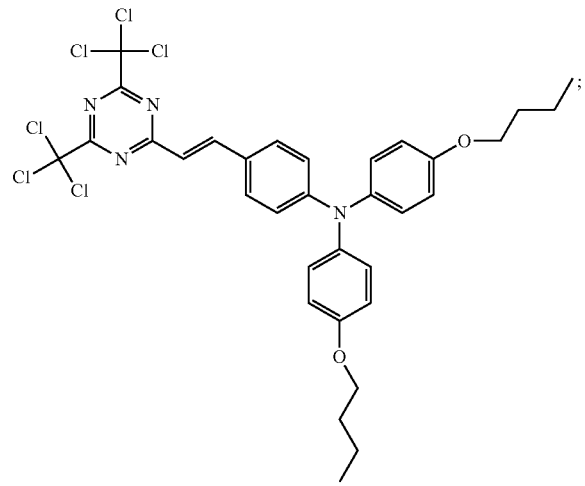

or,

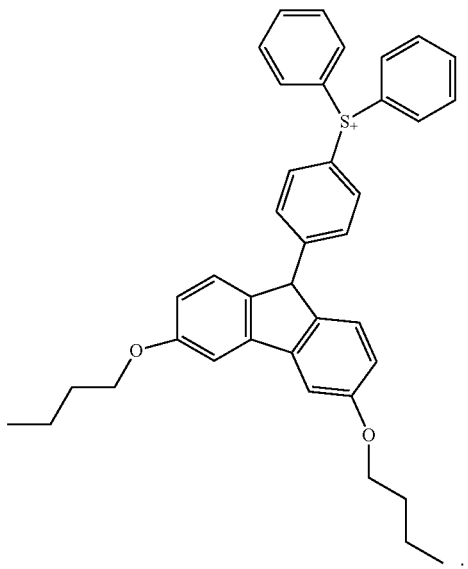

14. A display apparatus, comprising the display substrate according to claim 1.

15. The display substrate according to claim 3, wherein convex-concave structures are distributed in multiple rows and multiple columns, each row of the convex-concave structures includes the convex region, the second-type concave region and the first-type concave region which are arranged in succession.

16. The display substrate according to claim 15, wherein a distance between a center of the convex region and a center of the second-type concave region adjacent to the convex region is in a range of 1 μm to 50 μm.

17. The display substrate according to claim 15, wherein a distance between a center of the second-type concave region and the first-type concave region adjacent to the second-type concave region is in a range of 1 μm to 50 μm.

18. A manufacturing method for the display substrate according to claim 1, wherein the manufacturing method comprises:

forming the first electrode on one side of the base substrate;

forming the charge auxiliary layer mixed with the acid generator on one side of the first electrode away from the base substrate;

using preset light to irradiate the charge auxiliary layer under shielding of a mask, so that a convex-concave structure is formed on the surface of the charge auxiliary layer away from the first electrode and contents of the acid generator in regions with different thicknesses of the charge auxiliary layer are different, wherein the mask has a first region and a second region, and light transmittance of the first region and the second region is different; and forming the second electrode on one side of the charge auxiliary layer away from the first electrode, and forming the quantum dot light emitting layer before forming the second electrode.

19. The manufacturing method according to claim 18, wherein the charge auxiliary layer is zinc oxide mixed with the acid generator; and the forming the charge auxiliary layer mixed with the acid generator on the side of the first electrode away from the base substrate comprises:

mixing and dissolving zinc oxide particles and the acid generator to form a mixed solution; and spin-coating the mixed solution on the side of the first electrode away from the base substrate using a spin-coating process.

* * * * *